United States Patent
Hoshino et al.

[11] Patent Number: 5,972,786
[45] Date of Patent: *Oct. 26, 1999

[54] CONTACT HOLE STRUCTURE IN A SEMICONDUCTOR AND FORMATION METHOD THEREFOR

[75] Inventors: Kazuhiro Hoshino, Tokyo; Yukiyasu Sugano, Kanagawa, both of Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/478,910

[22] Filed: Jun. 7, 1995

Related U.S. Application Data

[62] Division of application No. 08/005,072, Jan. 15, 1993, abandoned.

[30] Foreign Application Priority Data

Jan. 21, 1992 [JP] Japan .................................. 4-008014

[51] Int. Cl.$^6$ .................................................. H01L 21/28
[52] U.S. Cl. .................... 438/627; 438/629; 438/632; 438/648; 438/656; 438/688
[58] Field of Search .................... 437/189, 190, 437/192, 194, 195; 438/648, 656, 688, 627, 629, 632, 643, 653, 658; 257/751, 763, 765, 767

[56] References Cited

U.S. PATENT DOCUMENTS

| | | |
|---|---|---|
| 4,924,295 | 5/1990 | Küecher . |
| 4,977,440 | 12/1990 | Stevens ................................... 257/767 |
| 5,036,382 | 7/1991 | Yamaha ................................... 257/765 |
| 5,106,781 | 4/1992 | Penning De Vries .................. 437/192 |
| 5,108,951 | 4/1992 | Chen et al. ............................. 437/187 |
| 5,312,772 | 5/1994 | Yokoyama et al. ..................... 437/190 |
| 5,472,912 | 12/1995 | Miller ..................................... 437/194 |

FOREIGN PATENT DOCUMENTS

| | | |
|---|---|---|
| 0 273 629 | 7/1988 | European Pat. Off. ............... 257/763 |
| 0 279 588 | 8/1988 | European Pat. Off. ............... 257/915 |
| 4-18760 | 1/1972 | Japan .................................... 257/767 |
| 61-208241 | 9/1986 | Japan . |
| 62-259470 | 1/1987 | Japan .................................... 257/915 |
| 1-241162 | 9/1989 | Japan .................................... 257/915 |
| 3-192768 | 8/1991 | Japan .................................... 257/915 |

OTHER PUBLICATIONS

IBM Technical Disclosure Bulletin, vol. 29, No. 11, Apr. 1987, Refractory Contact Stud, pp. 5091–5092.

*Primary Examiner*—T. N. Quach
*Attorney, Agent, or Firm*—Hill & Simpson

[57] ABSTRACT

A process for forming wiring over a migration preventing layer on a semiconductor substrate including forming a contact hole in a an insulation layer of the substrate and then filling the contact hole with an aluminum based alloy. A migration preventing layer is then formed, of a material which resists migration of atoms of the aluminum based alloy, over the surface of the aluminum based alloy. A wiring layer of aluminum is then formed over the migration preventing layer. In another embodiment, the contact hole may be provided with a first layer to prevent electron migration and a second layer which is a nitride of the first layer material.

1 Claim, 4 Drawing Sheets

CONTACT HOLE STRUCTURE IN A SEMICONDUCTOR AND FORMATION METHOD THEREFOR

This is a divisional of application Ser. No. 08/005,072, filed Jan. 15, 1993, abandoned.

BACKGROUND OF THE INVENTION

1. Field of the Invention

The present invention relates generally to wiring and a method for forming same. Particularly, the present invention relates to minute contact structures in semiconductor wiring which can resist electromigration as well as stress migration and the like.

2. Description of the Prior Art

Formation of circuit structures of aluminum, or aluminum based alloys on a semiconductor substrate is well known in the art. In semiconductor design, size reduction is increasingly desirable. For forming upper and lower strata of wiring, for example, or for realizing electrical resistance of wiring formed on a substrate, contact holes with very small aspect ratios have been developed. With such contact holes, which may have a circumference of 0.5 μm or less, shorting, or disconnection occurrence may result due to stress migration or alternatively, because of electromigration.

Two principle causes of stress migration are (1) compression stress maintained in a passivation layer of a semiconductor gives rise to variation in flexure and to expansion dependent on a return or 'snapback' force of an interior area of an aluminum (Al) (aluminum) wiring portion;

(2) in minute wiring structures, voids become enlarged due to a heat expansion coefficient value in wiring and passivation layers dependent on aluminum contraction.

Referring to FIG. 9, a cross-sectional view of a conventional semiconductor contact hole arrangement is shown. According to this construction, a silicon substrate 1 has a silicon oxide ($SiO_2$) insulating layer formed thereon wherein a contact hole 2a is defined with the silicon substrate 1 forming the bottom thereof. Subsequently, layered successively over the silicon substrate 1 and the $SiO_2$ insulating layer 2, a titanium (Ti) layer 3 and a titanium nitride (TiN) layer 4 are formed which also define the contact hole 2a. Thereover, an aluminum (Al) layer 5 Is formed so as to fill the contact hole 2a and over the aluminum layer 5 a SiN layer formed by plasma CVD method is deposited. Flexible variation, that is, expansion and contraction of the aluminum layer (wavy lines in FIG. 9) and, in the interior portion of the contact hole, pullback stress (arrow direction in FIG. 9) causes occurrence of disconnection, or short circuiting in conventional semiconductor structures.

On the other hand, electromigration, is based on a so-called 'electron wind' phenomenon, i.e. where aluminum atoms are transported by electron flow. Referring to FIG. 10, a cross-sectional view of a semiconductor arrangement having an aluminum layer 5 is shown in a condition wherein, at the contact hole, the silicon substrate forms a negative pole while the aluminum layer 5 forms a positive pole such that a void is formed. This portion has no aluminum (Al) supply source at the negative pole side. In the drawing, the arrow indicates the direction of current flow and numeral 1a indicates an impurity diffusion region.

In very minute circuitry, such as LSI devices, when reduced circumferences are employed for contact holes, such migration related disconnection problems become more pronounced.

SUMMARY OF THE INVENTION

It is therefore a principal object of the present invention to overcome the drawbacks of the prior art.

It is a further object of the present invention to provide a semiconductor circuit arrangement having high resistivity to electromigration and stress migration of aluminum (Al) in the area of contact holes.

In order to accomplish the aforementioned and other objects, a method of forming a semiconductor structure is provided, comprising the steps of: a) forming a contact hole in an insulating layer formed over a semiconductor substrate; b) depositing an aluminum based alloy in the contact hole; c) forming layer over the aluminum based alloy in the contact hole of a material selected to resist electron migration of atoms of the aluminum based alloy; and d) forming an aluminum based circuit layer above the migration resisting layer.

According to a further aspect of the invention, a method method of forming a semiconductor structure comprises the steps of: a) depositing an aluminum based alloy into a contact hole of an insulating layer formed over a semiconductor substrate so as to partially fill the contact hole; b) forming a first migration resisting layer over the layer of aluminum based alloy in the contact hole, the first migration resisting layer being formed of a material selected to resist electron migration of atoms of the aluminum based alloy; c) depositing an aluminum based alloy into the contact hole over the migration resisting layer such that the contact hole is substantially filled; d) forming a second migration resisting layer over the aluminum based alloy deposited over the first migration resisting layer in the contact hole, the second migration resisting layer being formed of a material selected to resist electron migration of atoms of the aluminum based alloy; and e) forming an aluminum based circuit layer above the migration resisting layer.

Another aspect of the invention provides a method of forming a semiconductor structure comprising the steps of: a) forming a contact hole in an insulating layer formed over a semiconductor substrate; b) coating at least the contact hole with a layer of a first material selected to resist electron migration of atoms of aluminum; c) coating the layer of the first material coating the contact hole with a layer of a second material, the second material being a nitride of the first material; d) heating the substrate to a temperature of equal to or less than 500° C.; e) depositing an aluminum based alloy in the contact hole so as to fill the contact hole; f) etching the aluminum based alloy such that a top surface of the aluminum is within the contact hole; g) forming a migration resistant layer over the top surface of the aluminum based alloy in the contact hole, the migration resistant layer being formed of a material selected so as to resist electron migration of atoms of the aluminum based alloy; and h) forming an aluminum based circuit layer above the migration resisting layer.

A still further aspect of the present invention teaches a method of forming a semiconductor structure comprising the steps of: a) forming a contact hole in an insulating layer formed over a semiconductor substrate; b) coating at least the contact hole with a layer of a first material selected to resist electron migration of atoms of aluminum; c) coating the layer of the first material coating the contact hole with a layer of a second material, the second material being a nitride of the first material; d) heating the substrate to a temperature of equal to or less than 500° C.; e) depositing an aluminum based alloy in the contact hole so as to fill the contact hole; f) etching the aluminum based alloy such that the aluminum based alloy partially fills the contact hole; g) forming a first migration resistant layer over the aluminum based alloy in the contact hole, the first migration resistant layer being formed of a material selected so as to resist electron migration of atoms of the aluminum based alloy; h) heating the substrate to a temperature of equal to or less than 500° C.; i) depositing an aluminum based alloy in the contact hole over the migration resistant layer so as to fill the contact hole; j) etching the aluminum based alloy such that the aluminum based alloy deposited in step i) substantially fills the contact hole; k) forming a second migration resistant layer over the aluminum based alloy deposited in the contact hole after the etching in step j), the migration resistant layer being formed of a material selected so as to resist electron migration of atoms of the aluminum based alloy; 1) heating the substrate to a temperature of equal to or less than 500° C.; and 1) forming an aluminum based circuit layer above the migration resisting layer.

Yet another aspect of the present invention provides a semiconductor structure comprising: an insulating layer formed over a semiconductor substrate defining a contact hole; an aluminum based alloy arranged within the contact hole; a migration resisting layer, of a material selected to resist electron migration of atoms of the aluminum based alloy, arranged over the aluminum based alloy within the contact hole; and an aluminum based circuit layer above the migration resisting layer.

Finally, according to the invention a semiconductor structure is provided, comprising: an insulating layer formed over a semiconductor substrate defining a contact hole; a first aluminum based alloy portion arranged to fill a lower portion of the contact hole; a first migration resisting layer, of a material selected to resist electron migration of atoms of the aluminum based alloy, arranged over the first aluminum based alloy portion within the contact hole; a second aluminum based alloy portion arranged over the first migration resisting layer so as to fill an upper portion of the contact hole; a second migration resisting layer, of a material selected to resist electron migration of atoms of the aluminum based alloy, arranged over the second aluminum based alloy portion arranged to fill the upper portion of the contact hole; and an aluminum based circuit layer above the second migration resisting layer.

DESCRIPTION OF THE PREFERRED EMBODIMENT

Figure 1:
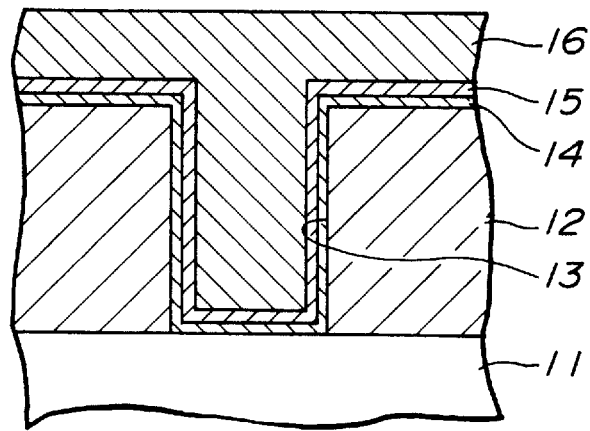
FIG. 1 shows a cross-sectional view of a first embodiment of a substrate having a wiring structure according to the method of the invention.
Figure 2:
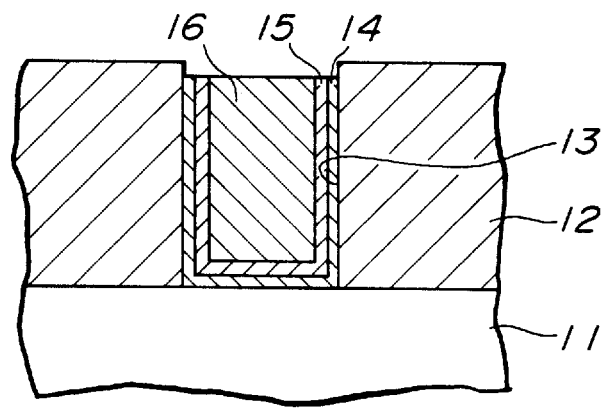
FIG. 2 shows an alternative arrangement of a wiring structure formed according to the method of the first embodiment.
Figure 3:
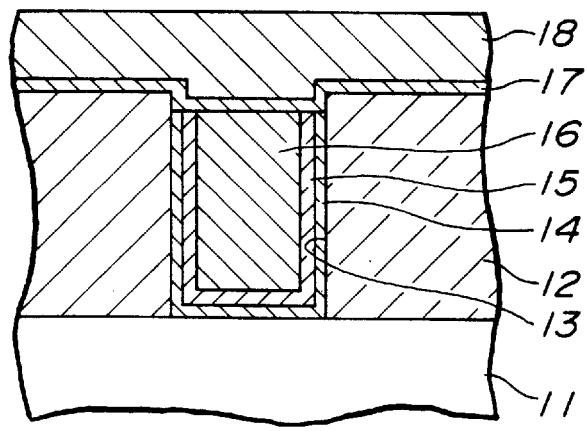
FIG. 3 shows a further development of the alternative arrangement of a wiring structure formed according to the method of the first embodiment.

Referring now to the drawings, particularly to FIGS. 1–3, a cross-sectional view of a semiconductor structure is shown. FIG. 1 shows a cross-sectional view at a first stage of the formation of the particular semiconductor component being formed, on a silicon substrate 11, in the FIGS. 1–3. As in the above-described semiconductor structures, an insulating layer 12 of $SiO_2$ is formed over the substrate 11 defining therethrough a contact hole 13. Then a titanium layer 14 and a titanium nitride layer 15 are successively formed over the insulating layer 12 by DC magnetron sputtering method, or the like, so as to coat the interior portion of the contact hole 13. Thereover, an aluminum (Al) layer 16 having 1% Si is deposited.

Hereinbelow, the thickness and formation conditions of the respective layers according to the method of the first embodiment will be described in detail.

Titanium Layer 14
1) . . . layer thickness: 30 nm
2) . . . gas and flow rate: Ar . . . $40_{SCCM}$
3) . . . pressure: 0.67 Pa
4) . . . substrate temperature: 150° C.

Titanium Nitride Layer 15
1) . . . layer thickness: 70 nm
2) . . . gas and flow rate: Ar-60%$N_2$ . . . $50_{SCCM}$
3) . . . pressure: 0.67 Pa
4) . . . substrate temperature: 150° C.

Aluminum (Al) 1% Si Layer 16
1) . . . layer thickness: 500 nm
2) . . . gas and flow rate: $40_{SCCM}$
3) . . . pressure: 0.67 Pa
4) . . . substrate temperature: 500° C.

As shown in FIG. 1, the aluminum w/1% Si layer 16 is deposited at a substrate temperature of 500° C., becoming substantially melted thus forming an aluminum wI 1% Si layer 16 with high aspect ratio over the underlying titanium nitride layer and becoming embedded in the contact hole 13. Then, referring to FIG. 2, dry etching is performed on the aluminum w/1% Si layer 16, the titanium nitride layer 15 and the titanium layer 14 such the the aluminum w/1% Si layer 16 is present in the contact hole 13 only. The conditions under which the etching is carried out are described below.

Etching mode: RIE type (variable direction mode)
Gas and flow rate: Boron trichloride ($BCl_3$) . . . $50_{SCCM}$
  Chlorine ($CL_2$) . . . $100_{SCCM}$
Pressure: 6.0 Pa
Power: 400 W After the above-described etching procedure, as seen in FIG. 3, a second titanium layer 17 is applied by magnetron spattering technique or the like, and a second aluminum w/1% Si layer 18 is applied over the second titanium layer 17. The conditions under which the second titanium layer 17 and the second aluminum w/1% Si layer 18 are applied are given in detail hereinbelow.

2nd Titanium Layer 17
1) . . . layer thickness: 50 nm
2) . . . gas and flow rate: Ar . . . $40_{SCCM}$
3) . . . pressure: 0.67 Pa
4) . . . substrate temperature: 150° C.
2nd Aluminum (Al) w/1% Si Layer 18
1) . . . layer thickness: 500 nm
2) . . . gas and flow rate: Ar . . . $40_{SCCM}$
3) . . . pressure: 0.67 Pa
4) . . . substrate temperature: 500° C.

After application of the second aluminum w/1% Si layer 18 over the second titanium layer 17 at a substrate temperature of 500° C., assuring a high aspect ratio for the second aluminum w/1% Si layer 18, application of an insulating layer, wiring or circuit formation or the like may be carried out in accordance with conventional LSI technique. Due the formation of the contact hole 13 with the migration resisting layer of titanium for resisting migration of atoms of the aluminum based alloy (i.e. Al w/1% Si), high resistance to electromigration and stress migration is assured. Further, according to the present embodiment, although the layer underlying the aluminum layer is of titanium (Ti) alternatively Wolfram (W), Zirconium (Zr), Hafnium (Hf), Molybdenum (Mo) or nitrides or suicides of these substances as well as titanium wolfram (TiW) or titanium oxynitride (TiON) are also preferable materials for forming the underlying layer.

Referring now to FIGS. 4–8, a second embodiment of the method according to the invention will be described herein below in detail.

According to the second embodiment, a plurality of migration resisting layers are successively formed for further enhancing electromigration and/or stress migration resistance.

Figure 4:
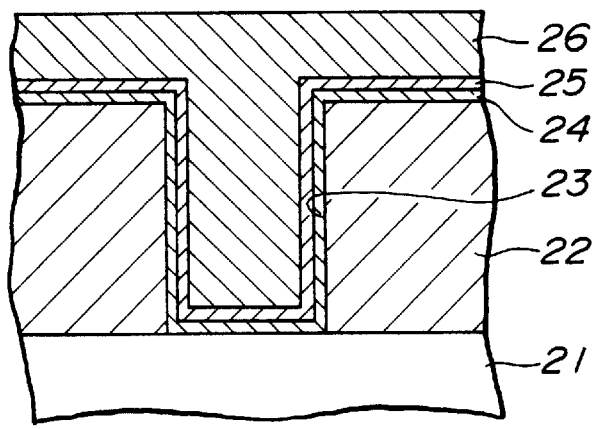
FIG. 4 shows a cross-sectional view of a second embodiment of a substrate having a wiring structure according to the method of the invention.
Figure 5:
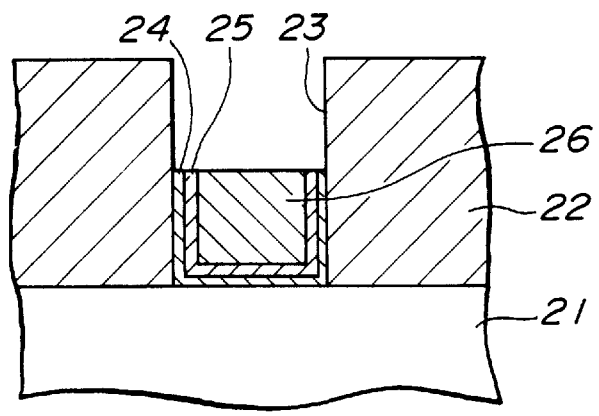
FIG. 5 shows an alternative arrangement of a wiring structure formed according to the method of the second embodiment.

Referring to FIG. 4, similarly to the first embodiment, an insulating layer 22 of $SiO_2$ is formed over the substrate 21 defining therethrough a contact hole 23. Then a titanium layer 24 and a titanium nitride layer 25 are successively formed over the insulating layer 22 by DC magnetron sputtering method, or the like, so as to coat the interior portion of the contact hole 23. Thereover, an aluminum (Al) layer 26 having 1% Si is deposited.

Hereinbelow, the thickness and formation conditions of the respective layers according to the method of the second embodiment will be described in detail.
Titanium Layer 24
1) . . . layer thickness: 30 nm
2) . . . gas and flow rate: Ar . . . $40_{SCCM}$
3) . . . pressure: 0.67 Pa
4) . . . substrate temperature: 150° C.
Titanium Nitride Layer 25
1) . . . layer thickness: 70 nm
2) . . . gas and flow rate: Ar-60%$N_2$ . . . $50_{SCCM}$
3) . . . pressure: 0.67 Pa
4) . . . substrate temperature: 150° C.
Aluminum (Al) w/1% Si Layer 26
1) . . . layer thickness: 500 nm
2) . . . gas and flow rate: $40_{SCCM}$
3) . . . pressure: 0.67 Pa
4) . . . substrate temperature: 500° C.

As will be noted, the above conditions are identical to the above-described first embodiment. As shown in FIG. 4, the aluminum w/1% Si layer 26 is deposited at a substrate temperature of 500° C., over the substantially wet surface of the underlying titanium layer 25 thus forming an aluminum w/1% Si layer 26 with high aspect ratio over the underlying titanium nitride layer and becoming embedded in the contact hole 23. Then, referring to FIG. 5, a first dry etching processing is performed on the aluminum w/1% Si layer 26, the titanium nitride layer 25 and the titanium layer 24 such the the aluminum w/1% Si layer 26 is present in the contact hole 23 only. The conditions under which the first etching processing is carried out are described below.
Etching mode: RIE type (variable direction mode)
Gas and flow rate: Boron trichloride ($BCl_3$) . . . $50_{SCCM}$
   Chlorine ($CL_2$) . . . $100_{SCCM}$
Pressure: 6.0 Pa
Power: 400 W According to the process of the second embodiment, the first etching process is carried out to a greater depth within the contact hole 23 than in the above-described first embodiment. Thus a substantial portion of the contact hole is left unfilled for subsequent formation of a second migration resisting layer as will be described hereinbelow.

Figure 6:
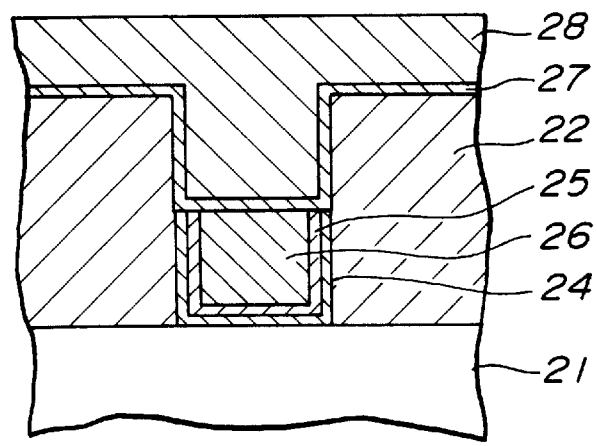
FIG. 6 shows a further development of the alternative arrangement of a wiring structure formed according to the method of the second embodiment.

After the above-described first etching procedure, as seen in FIG. 6, a second titanium layer 27 is applied by magnetron spattering technique or the like, and a second aluminum w/1% Si layer 28 is applied over the second titanium layer 27. The conditions under which the second titanium layer 27 and the second aluminum w/1% Si layer 28 are applied are given in detail hereinbelow.
Titanium Layer 27
1) . . . layer thickness: 30 nm
2) . . . gas and flow rate: Ar . . . $40_{SCCM}$
3) . . . pressure: 0.67 Pa
4) . . . substrate temperature: 150° C.
Aluminum (Al) w/1% Si Layer 28
1) . . . layer thickness: 500 nm
2) . . . gas and flow rate: Ar . . . $40_{SCCM}$
3) . . . pressure: 0.67 Pa
4) . . . substrate temperature: 500° C.

As will be noted, according to the process of the second embodiment, the thickness of the second titanium layer 27 is less than the second titanium layer 17 of the first embodiment (30 nm rather than 50 nm), however, according to the a dimension of a contact hole and substrate etc., the same thickness may alternatively be applied. Then, after application of the above layers 27 and 28 a second etching processing is carried out under identical conditions as the above-described first etching processing.

Figure 7:
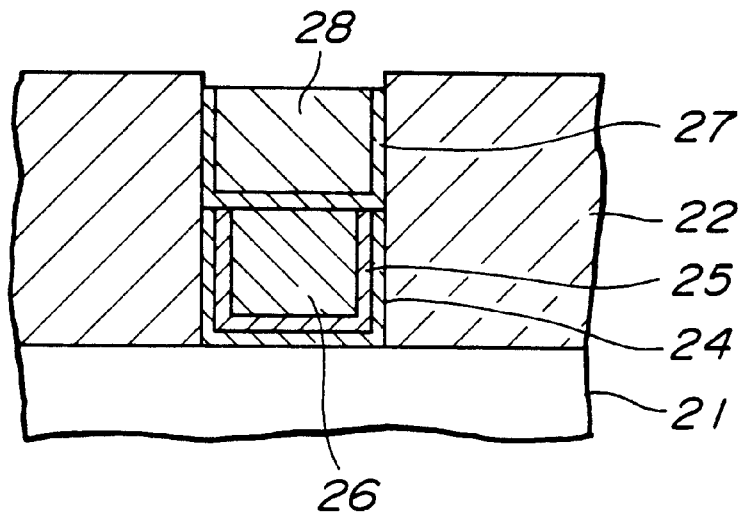
FIG. 7 shows an alternative development based on the arrangement of a wiring structure shown in FIG. 5.
Figure 8:
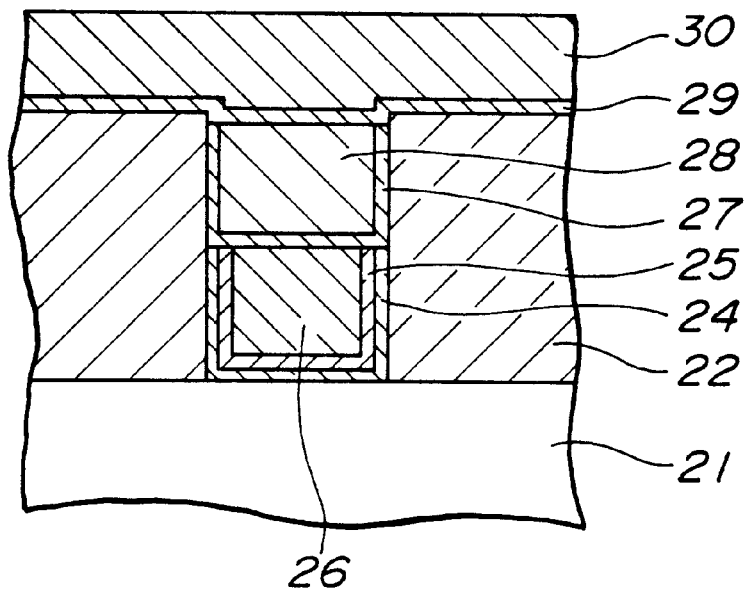
FIG. 8 shows another alternative development based on the arrangement of a wiring structure shown in FIG. 5.
Figure 9:
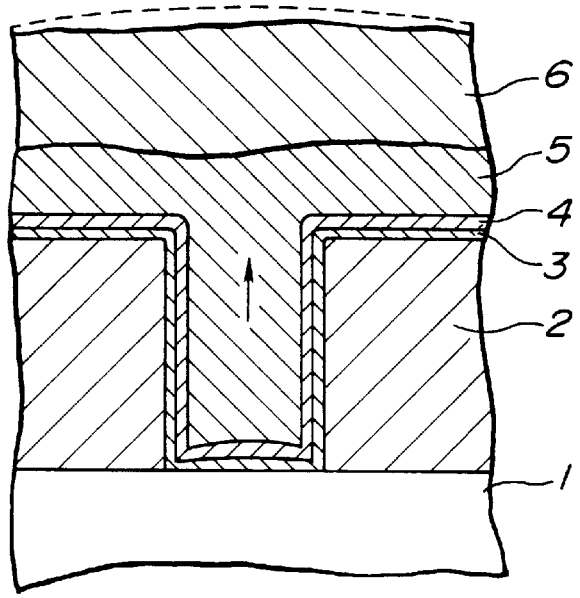
FIG. 9 shows a cross-sectional view of a wiring structure formed by conventional method.
Figure 10:
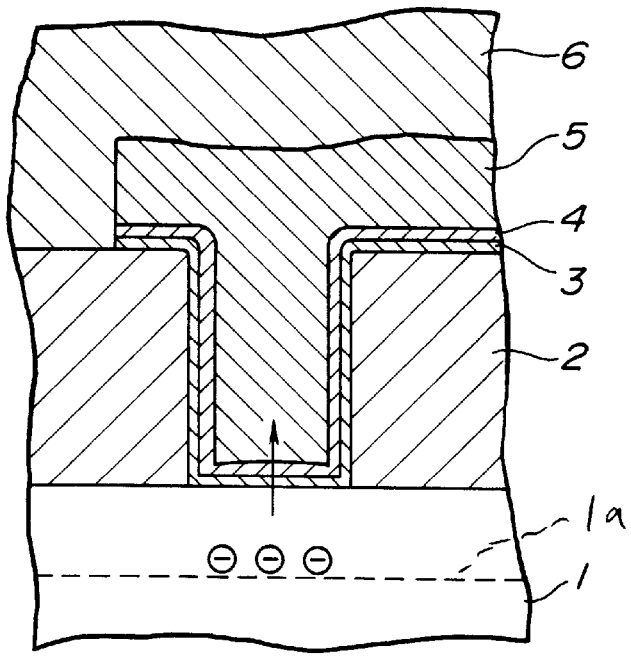
FIG. 10 shows a cross-sectional view of an alternative arrangement of a wiring structure formed by conventional method.

Referring to FIG. 7, after the second etching processing has been carried out, the contact hole is substantially filled, having therein two migration resisting layers 25 and 27 for inhibiting migration of atoms of the aluminum alloy layers 26 and 28. Then, after the above-described second etching processing, as seen in FIG. 8, a third titanium layer 29 is applied by magnetron spattering technique or the like, and a third aluminum w/1% Si layer 30 is applied over the third titanium layer 29. The conditions under which the third titanium layer 29 and the third aluminum w/1% Si layer 30 are applied are given in detail hereinbelow.
3rd Titanium Layer 29
1) . . . layer thickness: 50 nm
2) . . . gas and flow rate: Ar . . . $40_{SCCM}$
3) . . . pressure. 0.67 Pa
4) . . . substrate temperature: 150° C.
3rd Aluminum (Al) w/1% Si Layer 30
1) . . . layer thickness: 500 nm
2) . . . gas and flow rate: Ar . . . $40_{SCCM}$
3) . . . pressure: 0.67 Pa
4) . . . substrate temperature: 500° C.

As may be appreciated the above third titanium layer 29 and the third aluminum w/1% Si layer 30 are applied under identical conditions to the second layer 27 and 28 as described hereinbefore. Application of the third aluminum w/1% Si layer 30 over the third titanium layer 29 at a substrate temperature of 500° C., assures a high aspect ratio for the third aluminum w/1% Si layer 30. Subsequently application of an insulating layer, wiring or circuit formation or the like may be carried out in accordance with convention LSI technique. Due the formation of the contact hole 23 with a plurality of migration resisting layers of titanium further improvement of the high resistance characteristics relative electromigration and stress migration is assured. Further, according to the second embodiment, as in the first embodiment described previously, although the layer underlying the aluminum layer is of titanium (Ti), alternatively Wolfram (W), Zirconium (Zr), hafnium (Hf), Molybdenum (Mo) or nitrides or silicides of these substances as well as titanium wolfram (TiW) or titanium oxynitride (TiON) are also preferable materials for forming the underlying layer.

In addition, according to the present invention, although the above embodiments describe a semiconductor device in terms of application of a single wiring, or circuit layer, the process of the present invention may be applied to devices having multiple layers of wiring. Further due to the high aspect ratio of the aluminum layer, highly reliable high density semiconductor devices may be realized.

While the present invention has been disclosed in terms of the preferred embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A method of forming a semiconductor structure, comprising the steps of:

a) forming a contact hole in an insulating layer formed over a semiconductor substrate;

b) coating at least said contact hole with a layer of a first material selected to resist electron migration of atoms of aluminum;

c) coating said layer of said first material coating said contact hole with a layer of a second material, said second material being a nitride of said first material, said first and second materials being Ti and TiN;

d) heating said substrate to a temperature of equal to or less than 500° C., said temperature being at least a melting point for an aluminum based alloy;

e) depositing said aluminum based alloy in said contact hole so as to fill said contact hole;

f) etching said aluminum based alloy such that a top surface of said aluminum is within said contact hole;

g) forming a migration resistant layer over said top surface of said aluminum based alloy in said contact hole, said migration resistant layer being formed of a material selected so as to resist electron migration of atoms of said aluminum based alloy; and h) forming an aluminum based circuit layer above said migration resisting layer.

* * * * *